(12) United States Patent
Myung et al.

(10) Patent No.: US 9,705,640 B2
(45) Date of Patent: Jul. 11, 2017

(54) METHOD AND APPARATUS FOR DECODING RECEIVED PACKETS IN BROADCASTING AND COMMUNICATION SYSTEM

(71) Applicant: Samsung Electronics Co. Ltd., Suwon-si, Gyeonggi-do (KR)

(72) Inventors: Seho Myung, Seoul (KR); Hyun-Koo Yang, Seoul (KR); Sung-Hee Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 439 days.

(21) Appl. No.: 14/046,209

(22) Filed: Oct. 4, 2013

(65) Prior Publication Data

US 2014/0101521 A1  Apr. 10, 2014

(30) Foreign Application Priority Data

Oct. 9, 2012  (KR) ........................ 10-2012-0112070

(51) Int. Cl.
*H03M 13/00* (2006.01)
*H03M 13/09* (2006.01)
*H03M 13/11* (2006.01)
*H03M 13/15* (2006.01)
*H03M 13/27* (2006.01)
(Continued)

(52) U.S. Cl.
CPC ...... *H04L 1/0057* (2013.01); *H03M 13/2707* (2013.01); *H03M 13/373* (2013.01); *H03M 13/6356* (2013.01); *H04L 1/0041* (2013.01); *H04L 1/0045* (2013.01); *H04L 1/0071* (2013.01); *H04L 1/0075* (2013.01); *H03M 13/098* (2013.01); *H03M 13/1102* (2013.01); *H03M 13/1515* (2013.01); *H04L 2001/0093* (2013.01)

(58) Field of Classification Search
CPC ... H04L 1/0057; H04L 1/0045; H04L 1/0083; H04L 1/004; H03M 13/03; H03M 13/293
USPC .............................. 714/776, 752, 758, 786
See application file for complete search history.

(56) References Cited

U.S. PATENT DOCUMENTS 5,121,395 A * 6/1992 Millar ........................ 714/762
6,004,028 A * 12/1999 Bottomley .................... 714/758
(Continued)

OTHER PUBLICATIONS

Qualcomm Inc., Proposed MBMS FEC Code: Proposed MBMS FEC Code based on IETF RFC6330, S4-121053, 3GPP TSG-SA4 Meeting #70, Chicago, IL, Aug. 13-17, 2012.
(Continued)

Primary Examiner — James C Kerveros
(74) Attorney, Agent, or Firm — Jefferson IP Law, LLP

(57) ABSTRACT

A method and apparatus for decoding received packets in a broadcasting and communication system is provided. The method includes reconstructing a source block by arranging source packets received from a sender on a two-dimensional array having a width of a given symbol size, and determining at least one Erased Subdivided Encoding Symbol Index (E-SESI) corresponding to at least one source packet which is not successfully received in the reconstructed source block, determining a symbol unit for Forward Error Correction (FEC) decoding based on the at least one E-SESI, and performing FEC decoding on the reconstructed source block depending on the determined symbol unit.

12 Claims, 12 Drawing Sheets

(51) Int. Cl.
*H04L 1/00* (2006.01)
*H03M 13/37* (2006.01)

(56) References Cited

U.S. PATENT DOCUMENTS

| | | | |
|---|---|---|---|
| 6,697,985 B1* | 2/2004 | Ilani | 714/751 |
| 6,732,325 B1* | 5/2004 | Tash et al. | 714/785 |
| 7,634,706 B1* | 12/2009 | Chen et al. | 714/760 |
| 7,660,245 B1 | 2/2010 | Luby | |
| 8,732,558 B1* | 5/2014 | Park et al. | 714/774 |
| 2005/0251723 A1* | 11/2005 | Ilani | 714/752 |
| 2006/0077890 A1 | 4/2006 | Suryavanshi et al. | |
| 2008/0240011 A1 | 10/2008 | Kim et al. | |
| 2012/0096328 A1* | 4/2012 | Franceschini et al. | 714/758 |

OTHER PUBLICATIONS

ETRI, Draft Change Request 26.346, Graceful Degradation-FEC for MBMS streaming delivery (Release 11), S4-121061, 3GPP TSG-SA4 Meeting #70, Chicago, IL Aug. 13-17, 2012.

3GPP TS 26.346, V11.2.0, 3rd Generation Partnership Project; Technical Specification Group Services and System Aspects; Multimedia Broadcast/Multicast Service (<B<S); Protocols and codecs (Release 11); Sep. 1, 2012.

\* cited by examiner

| Source Block Number (SBN) (301) | Encoding Symbol ID (ESI) (302) | Packet Start Position (PSP) (303) |
|---|---|---|

- Source Block Number (SBN) : An integer identifier for the source block that the source data within the packet relates to.
- Encoding Symbol ID (ESI): The starting symbol index of the source packet in the source block.
- Packet Start Position (PSP): The starting region index of the source packet in the source block

| Source Block Number (SBN) (304) | Encoding Symbol ID (ESI) (305) | Source Block Length (SBL) (306) |
|---|---|---|

- Source Block Number (SBN): An integer identifier for the source block that the repair symbols within the packet relate to.
- Encoding Symbol ID (ESI): An integer identifier for the encoding symbols within the packet.
- Source Block Length (SBL): The number of source symbols in the source block.

FIG.3

| Source Block Number (SBN) (401) | Subdivided Encoding Symbol ID (SESI) (402) |
|---|---|

- Source Block Number (SBN) : An integer identifier for the source block that the source data within the packet relates to.
- Subdivided Encoding Symbol ID (SESI): The starting subdivided-symbol index of the source packet in the source block.

FIG.4

| Symbol Size (T) (1001) | Number of Subdivided Symbols (m) (NSS) (1002) | Maximum Source Block Length (1003) |
|---|---|---|

- Symbol Size (T): The size of an encoding symbol, in bytes.
- Number of Subdivided Symbols (NSS) (m): The number of subdivided symbols for an encoding symbol
- Maximum Source Block Length: The maximum length of a source block, in symbols.

FIG.10A

| Symbol Size (T) (1001) | Number of Regions (m) (NOR) (1004) | Maximum Source Block Length (1003) |
|---|---|---|

- Symbol Size (T): The size of an encoding symbol, in bytes.
- Number of Regions (NOR) (m): The number of regions in the source block
- Maximum Source Block Length: The maximum length of a source block, in symbols.

FIG.10B

FEC OBJECT TRANSMISSION INFORMATION ~1102

| Symbol Size (T) (1001) | Number of Subdivided Symbols (m) (NSS) (1002) | Maximum Source Block Length (1003) |
|---|---|---|

SOURCE PACKET-ADDED INFORMATION (SOURCE FEC PAYLOAD ID) ~1104

| Source Block Number (SBN) (401) | Subdivided Encoding Symbol ID (SESI) (402) |
|---|---|

REPAIR PACKET-ADDED INFORMATION (REPAIR FEC PAYLOAD ID) ~1106

| Source Block Number (SBN) (304) | Encoding Symbol ID (ESI) (305) | Source Block Length (SBL) (306) |
|---|---|---|

FIG.11

METHOD AND APPARATUS FOR DECODING RECEIVED PACKETS IN BROADCASTING AND COMMUNICATION SYSTEM

CROSS-REFERENCE TO RELATED APPLICATION(S)

This application claims the benefit under 35 U.S.C. §119 (a) of a Korean patent application filed on Oct. 9, 2012 in the Korean Intellectual Property Office and assigned Serial No. 10-2012-0112070, the entire disclosure of which is hereby incorporated by reference.

TECHNICAL FIELD

The present disclosure relates to a broadcasting and communication system. More particularly, the present disclosure relates to a method and apparatus for efficiently restoring data upon occurrence of a loss of the data in a channel or a network.

BACKGROUND

In the recent broadcast and communication environment, network data congestion has significantly increased due not only to the increase in a variety of multimedia content, but also to the increase in high-capacity content such as High Definition (HD) content or Ultra High Definition (UHD) content. Due to these circumstances, the content sent by a sender (for example, a host A) may not be normally delivered to a receiver (for example, a host B). For example, some of the content may be lost in the transmission route of a channel or the network. In many cases, since data is transmitted in packets (or in units of packets), data loss may also occur in packets. Due to the data loss in the network, the receiver may not receive data packets, so the receiver may not determine the data in the lost packets. In turn, this may cause various types of user inconveniences such as degradation of audio, degradation of video, image distortion, subtitle missing, and file loss. For this reason, there is a need for technology for repairing (or recovering) the data lost in the network.

One technology for allowing a receiver to repair the data lost in the network configures (or constructs) a source block with a predetermined number of data packets, which are called source packets and may have different lengths, and adding repair information such as parity data or repair packet to the source block by Forward Error Correction (FEC) encoding. If there is lost data, the receiver may perform decoding using the repair information.

As for each of the source packets to which the repair information is attached, a source packet whose length is not a desired value may undergo zero padding. In other words, the existing structure of a source block is likely to include a significant amount of zero padding depending on the length of the packets. The zero-padded data is a meaningless value that is not transmitted by the sender, but it has an impact on the increase in the number of symbols constituting the source block and is involved in making parity data, actually causing the same effect as generating and transmitting the parity for unnecessary information.

By reducing the desired length of the source packets to solve these problems, the amount of zero padding may be reduced. In this case, however, as the number of symbols constituting the source block may significantly increase, FEC codes of a very long length may be required. The length of FEC codes that can be used in the system is limited, and as the length of codes is longer, the complexity may significantly increase during Maximum log-Likelihood (ML) decoding, causing an increase in decoding latency.

Therefore, there is a need for an efficient source block configuration method capable of reducing the number of encoding symbols and improving the error correction capability by reducing zero-padded data, and for technology capable of allowing a receiver to efficiently repair the lost data using the received source packets and repair packets.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a method and apparatus for transmitting and receiving packet data in a broadcasting and communication system.

Another aspect of the present disclosure is to provide a method and apparatus for efficiently restoring data upon occurrence of a loss of data in a broadcasting and communication system.

Another aspect of the present disclosure is to provide a method and apparatus capable of efficiently restoring an erased data packet using received source packets and repair packets in a broadcasting and communication system.

In accordance with an aspect of the present disclosure, a method for decoding received packets in a broadcasting and communication system is provided. The method includes reconstructing a source block by arranging source packets received from a sender on a two-dimensional array having a width of a given symbol size, determining at least one Erased Subdivided Encoding Symbol Index (E-SESI) corresponding to at least one source packet which is not successfully received in the reconstructed source block, determining a symbol unit for Forward Error Correction (FEC) decoding based on the at least one E-SESI, and performing FEC decoding on the reconstructed source block depending on the determined symbol unit.

In accordance with another aspect of the present disclosure, an apparatus for decoding received packets in a broadcasting and communication system is provided. The apparatus includes a source block analyzer configured to reconstruct a source block by arranging source packets received from a sender on a two-dimensional array having a width of a given symbol size, determine at least one E-SESI corresponding to at least one source packet which is not successfully received in the reconstructed source block, and determine a symbol unit for FEC decoding based on the at least one E-SESI, and a decoder configured to perform FEC decoding on the reconstructed source block depending on the determined symbol unit.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 3 illustrates an example of signaling information added to a source packet and a repair packet according to an embodiment of the present disclosure;

FIG. 4 illustrates an example of signaling information added to a source packet according to an embodiment of the present disclosure;

FIGS. 10A and 10B illustrate examples of FEC Object Transmission Information (OTI) according to an embodiment of the present disclosure;

FIG. 11 illustrates one set for signaling information according to an embodiment of the present disclosure;

Throughout the drawings, like reference numerals will be understood to refer to like parts, components, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Embodiments of the present disclosure provide a method for efficiently repairing lost or erased data packets in electronic devices such as cellular phones, TVs, computers, electronic blackboards, tablet computers, E-books, and the like, which can transmit and receive not only high-capacity content such as High Definition (HD) content or Ultra High Definition (UHD) content but also a variety of multimedia services such as video conferencing/call, over the network. In particular, embodiments of the present disclosure provide a method capable of efficiently configuring (or constructing) a source block when applying Forward Error Correction (FEC) to data packets, thereby improving the decoding performance or increasing the transmission efficiency. Although a specific FEC encoding method will not be mentioned in this specification, it should be noted that the FEC encoding method is not limited to a specific FEC method such as Reed-Solomon (RS) codes, Low Density Parity Check (LDPC) codes, Turbo codes, Raptor codes, RaptorQ codes, Single Parity-Check Code (SPC) codes, Pro-Moving Picture Experts Group (MPEG) FEC codes, or the like.

Figure 1A:
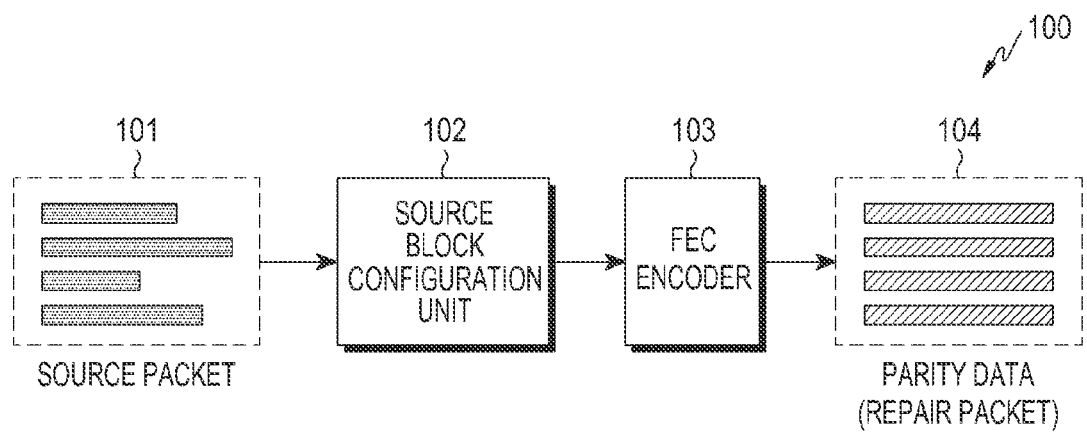
FIGS. 1A and 1B are block diagrams illustrating schematic structures of a sender and a receiver according to an embodiment of the present disclosure.
Figure 1B:
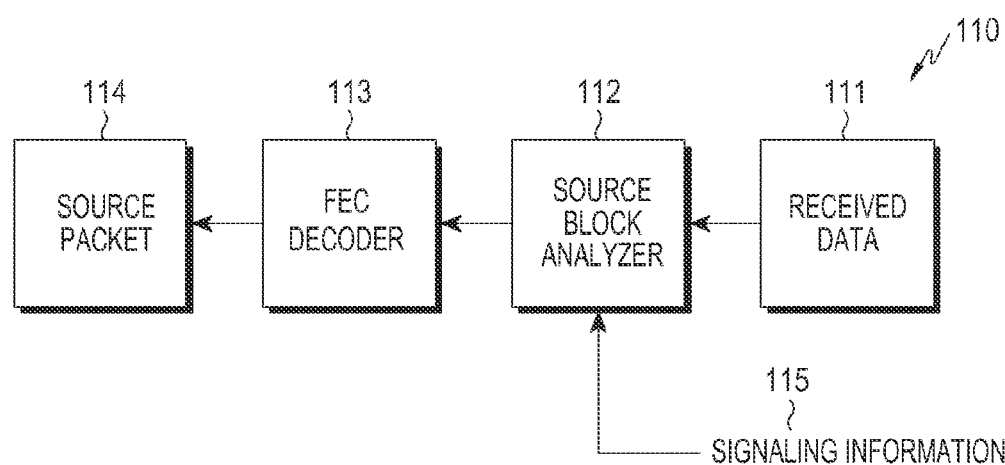

FIGS. 1A and 1B are block diagrams illustrating schematic structures of a sender and a receiver according to an embodiment of the present disclosure.

Referring to FIG. 1A, a sender 100 may include a source block configuration unit 102 and an FEC encoder 103. The source block configuration unit 102 may configure (or construct) a source block using a certain number of data packets, which are called source packets 101 and may have different lengths. The FEC encoder 103 may add repair information 104 such as parity data or a repair packet to the source block by applying FEC, and transmit the FEC-encoded data.

Referring to FIG. 1B, a receiver 110 may include a source block analyzer 112 and an FEC decoder 113. The source block analyzer 112 may divide received data 111 comprised of a source block into source symbols to which repair blocks are added, and the FEC decoder 113 may repair source packets 114 by performing FEC decoding on the source symbols. The source block analyzer 112 may repair the missing data using signaling information 115 which is received along with or separately from the received data 111.

Figure 2:
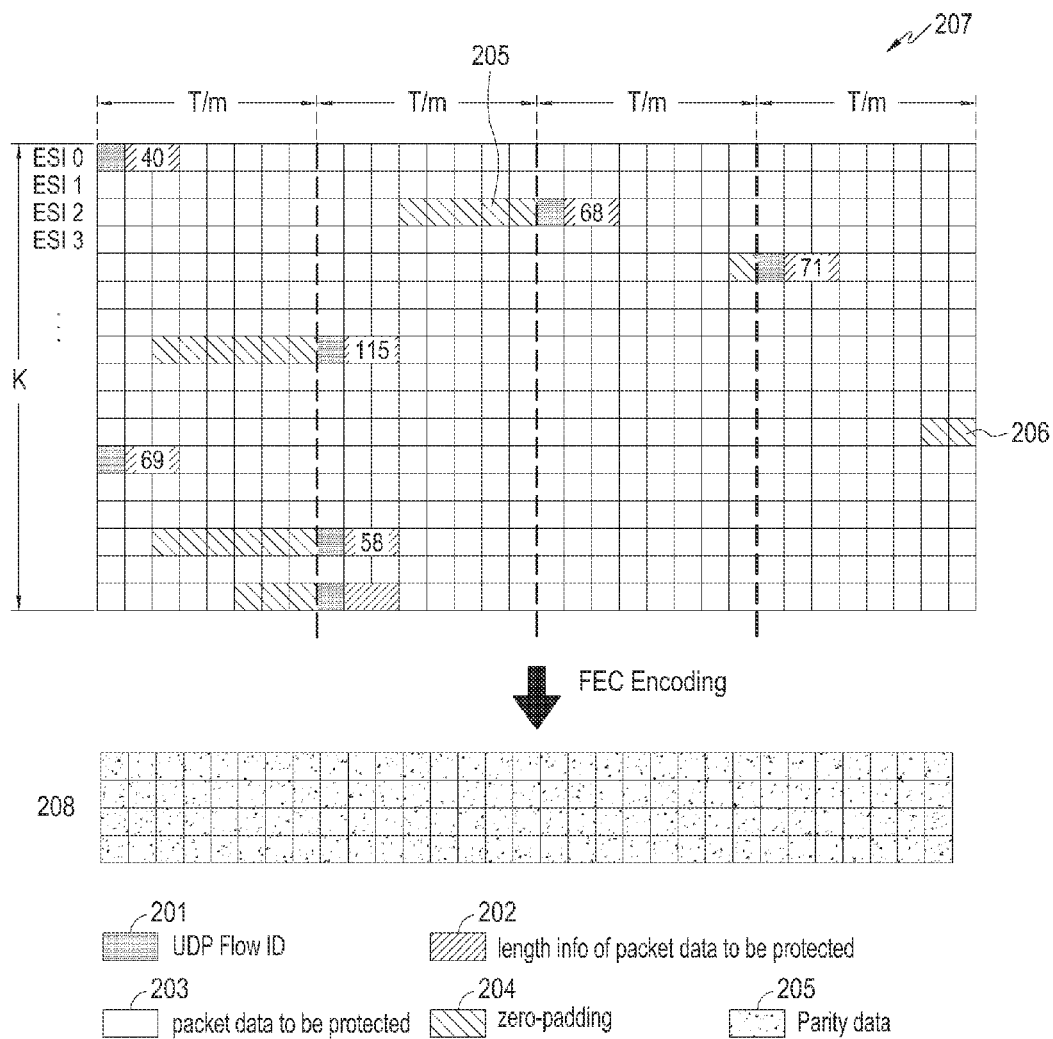
FIG. 2 illustrates a structure of a source block according to an embodiment of the present disclosure.

FIG. 2 illustrates a structure of a source block according to an embodiment of the present disclosure.

Referring to FIG. 2, given source packets may be sequentially arranged on a two-dimensional array 207 having a width T. Each row of the array 207 may be called a 'symbol', and its T value may be called a 'symbol size'. The symbol size is usually expressed in bytes or bits, and in this specification, length information of the source packets may usually represent a length in bytes unless otherwise stated.

Referring to FIG. 2, the source block configuration unit 102 may divide the two-dimensional array 207 having a width of a symbol size T into m regions each comprised of T/m columns. In the example of FIG. 2, m=4. If T is not a multiple of m, the array may be divided into regions comprised of [T/m]+1 columns and regions comprised of [T/m] columns. The regions comprised of [T/m]+1 columns and the regions comprised of [T/m] columns may be defined by an agreement made between a sender and a receiver, or by specifying the number of columns for each of the regions. The term 'agreement' as used herein may refer to an agreement that if, for example, a remainder n determined by dividing T by m is n<m, first n regions may be divided into [T/m]+1 columns and the remaining (m−n) regions may be divided into [T/m] columns. Aside from the regular division of the regions, the number of columns constituting each region may be set differently depending on the agreement between the sender and the receiver.

If necessary, packet attribute information 201 such as a flow Identifier (ID) (for example, a User Datagram Protocol (UDP) flow ID), and information 202 indicating a packet length may be attached to some source packets. The source packets, to which the information 201 and 202 is added, may be sequentially arranged so as not to exceed the symbol size T, beginning from the first column of the first row.

The remaining part in the region to which the last data of a source packet is allocated in the last row in which the source packet, to which additional information is attached, is arranged may be allocated (or be set as) a certain value at all times. The certain value may be set as zero (0) for convenience, but it is not necessarily limited thereto. For example, in FIG. 2, since the last data of the first packet in which the size of data to be protected 203 is 40 is allocated in the second region among the four regions, a remaining part 205 of the second region is padded with a value of zero (0) using zero-padding 204.

After one source packet, to which the additional information 201 and 202 is attached, is arranged, a source packet to be arranged next may be arranged beginning from the starting point of the next region following the region in which the last data of the previous source packet is allocated in the last row in which the previous source packet is arranged. In other words, all source packets need to be arranged beginning from the starting point of a certain region. For example, in FIG. 2, the second source packet in which the length of data to be protected is 68 is arranged beginning from the starting point of the third region following the zero-padded data 205. If the zero-padded data is allocated in the last region, like the zero-padded part 206 of the fourth source packet in which the size of data to be protected is 115, then the following fifth source packet begins at the first region of the next row. After the above processes are completed for all of the given source packets, the array 207 comprised of K rows will be referred to as a 'source block', and each row in the source block will be referred to as a 'source symbol'.

After configuring the source block 207, the sender 100 may generate parity data 208 by performing FEC encoding by means of the FEC encoder 103 in FIG. 1A. The FEC encoder 103 may apply FEC encoding in units of source symbols. If some source symbols, which are subdivided on the basis of each region in each source symbol, are defined as subdivided symbols or subdivided encoding symbols, the FEC encoder 103 may apply FEC encoding in units of subdivided symbols.

Reference will be made to FIG. 2 to show an example of the application of FEC in units of source symbols. K rows in the source block 207 may be regarded as K source symbols to which FEC encoding is to be applied, and repair (or parity) symbols 208 may be generated by applying FEC encoding to the K source symbols. The source symbols and the repair symbols will be collectively referred to as 'encoding symbols'.

The application of FEC in units of subdivided source symbols means the application of FEC for each of the regions divided in FIG. 2. In other words, each source symbol includes four subdivided source symbols each comprised of T/m bytes (or bits).

The structure of the source block proposed in an embodiment of the present disclosure may be summarized as follows.

The two-dimensional array with a given symbol size of T may be divided into m regions having a size of T/m on the basis of columns. If T is not a multiple of m, the array may be divided into regions comprised of [T/m]+1 columns and regions comprised of [T/m] columns. Thereafter, for given source packets, additional information is attached thereto, if necessary, and then they are sequentially arranged in the two-dimensional array so as not to exceed the symbol size. In an alternative embodiment, after the number m of given regions is determined, T may be defined to be a multiple of m.

Each source packet needs to be arranged beginning from the column where each of m divided regions starts, and the remaining part in the region to which the last data of a source packet is allocated in the last row in which the source packet, to which additional information is attached, is arranged may be allocated a value such as zero (0) at all times.

In some cases, zero padding of T/m bytes or more may be applied between the arranged source packets depending on the needs of the system. Typically, however, the maximum length of zero padding may be set less than T/m in order to minimize the percentage of zero padding. Therefore, after one source packet, to which the additional information is attached, is arranged, a source packet to be arranged next may be typically arranged beginning from the starting point of the next region following the region in which the last data is allocated in the last row in which the source packet is arranged. If the last data is allocated in the last m-th region, the column of the next source packet may start at the first region of the next row.

The 3rd Generation Partnership Project (3GPP) Service Aspects 4 (SA4) Multimedia Broadcast and Multicast Service (MBMS) standard applies Raptor codes for Application Layer-Forward Error Correction (AL-FEC), and the maximum possible source symbol length of the Raptor code is 8192. If FEC codes are used, in which the number of given source packets is greater than or equal to certain criteria, like the Raptor codes, there is a limit in decreasing T to reduce the number of padding bytes in configuring a source block.

In the case where the source block structure of the present disclosure is applied to the 3GPP SA4 MBMS standard, if a source block is configured by dividing T by m for given source packets within the maximum possible source symbol length of 8192 of the Raptor code, it is possible to reduce the number of encoding symbols and improve the error correction capability by reducing the number of padding bytes.

As a specific example, if it is assumed that there are 1000 source packets and a length of each source packet is randomly determined between 512 bytes and 1024 bytes, the average length of the source packers is 768 bytes, so the total amount of data may be approximately 768000 bytes. If T is set as 128 bytes, the average amount of padding per source packet is 64 bytes, so the total amount of padding may be 64000 bytes. As a result, the total amount of generated source block may be 832000 bytes. Since T is 128, the number of source symbols is 6500.

If m=4 as the present disclosure is applied, the size of the subdivided source symbols is T/4=32 and padding of 16 bytes occurs per source packet, so the total amount of padding may be 16000 bytes. As a result, the total amount of the source block may be 784000 bytes. Since T/4=32, the number of subdivided source symbols may be 24500, and the number of source symbols may be determined as 6125. As a result, compared to the existing method, the present disclosure may reduce the number of source symbols by 6500−6125=375. If m is set to 8, 16, . . . (m=8, 16, . . . ), more effects may be obtained.

In the source block structure of FIG. 2, if m>2, the amount of zero padding may be effectively reduced, compared to when m=1. For example, in the case where the length of source packets variably changes, it can be expected that if the two-dimensional array is divided into m regions, the amount of zero padding may be reduced by 1/m on average. As a result, it can be expected that if m>2, the number of source symbols, to which FEC encoding is applied, may be reduced, compared to when m=1.

It will be assumed that the number of source symbols is K1, which are generated from given source packets and the symbol size T, for m=1, and Np repair symbols are generated from the source symbols by applying FEC. In addition, it will be assumed that K2 source symbols are generated from the same source packets and symbol size T, for m>2, and the same number Np of repair symbols are generated by applying the same FEC. Since the same number of repair symbols are generated from the same number of source packets, it may be determined that both cases are the same in terms of the overhead. However, when FEC code rates K1/(K1+Np) and K2/(K2+Np) of both cases are compared with each other, K1/(K1+Np)>K2/(K2+Np) since it is obvious that K1>K2. It is generally well known that if the code rate is lower for the same amount of parity information in the same FEC technique, the more robust protection performance is shown.

Therefore, compared to the existing method, the disclosed embodiment of the present disclosure may provide better error correction performance without the need for additional overhead by efficiently reducing the amount of zero padding by increasing m.

Actually, in a source block structure with m=1, if one source packet is erased, it is determined that all rows (for example, all encoding symbols) in which the source packet was arranged in the source block are erased. However, an embodiment of the present disclosure may separate the erased parts and the non-erased parts by dividing the rows or encoding symbols in the source block into m regions. As a result, the non-erased parts in the m regions may be used for decoding, contributing to the improvement of the decoding performance.

In order to apply FEC using the source block structure proposed in an embodiment of the present disclosure, the sender may deliver, to the receiver, information about the number of divided regions in the source block and about the region at which each of the source packets start. Upon failure to obtain this information, the receiver may not determine the position in which the erased source packet was arranged in the source block, making it difficult to perform FEC decoding.

Signaling information for the symbol size T and the number m of divided regions may be transmitted by being added to each source packet, or may be transmitted using a separate packet. As an example of transmitting the signaling information using a separate packet, T and m may be transmitted using a Content Delivery Protocol (CDP) such as a Session Description Protocol (SDP), when FEC-related information is transmitted. If T is not a multiple of m, the receiver may determine the number of columns in each region based on the values of T and m in accordance with an agreement (for example, the front regions have [T/m]+1 columns and the rear regions have [T/m] columns).

As another example, in order to allow the receiver to determine the pattern in which the received source packets are arranged in the source block, information indicating the position (for example, the order of an encoding symbol and the position of a region at which the encoding symbol starts) of the row at which the arrangement of each source packet starts, may be transmitted by being added to each source packet.

FIG. 3 illustrates an example of signaling information added to a source packet and a repair packet according to an embodiment of the present disclosure.

Referring to FIG. 3, a Source Block Number (SBN) 301 indicates a source block that the source packet corresponds to. An Encoding Symbol ID (ESI) 302 indicates the position of the first encoding symbol (for example, the row in the source block) at which the source packet starts. A Packet Start Position (PSP) 303 indicates the region at which the source packet starts to be arranged in the source block. For example, if m=4 in FIG. 2, a value of ESI and PSP of the first source packet may be (0,0); a value of ESI and PSP of the second source packet may be (2, 2); a value of ESI and PSP of the third source packet may be (4, 3); and a value of ESI and PSP of the fourth source packet may be (7, 1).

If at least one source packet is erased and some of a source symbol corresponding thereto is erased, at least one repair symbol is required to repair the erased source symbol by FEC decoding.

To each repair symbol may be added an SBN 304 indicating a source block from which the repair symbol is generated, an ESI 305 related to the order of the repair symbol, and a Source Block Length (SBL) 306 for determining the exact size of the source block. In an alternative embodiment, the signaling fields 304, 305 and 306 may be transmitted to the receiver using a separate means.

In order to restore or repair at least one erased packet like in the above example, the SBN 304 indicating correlation between the source block and the repair symbol, the ESI 305 related to the order in which the repair symbol is generated using FEC, and the SBL 306 for determining the length T of the source symbol and the size of the source block, are required.

If no source packet is erased, information about repair symbols is not required, so not only the SBN 304 and the ESI 305 but also configuration information of the source block are not required. As a result, the SBL 306 is also not required.

The size of each of the signaling fields 301, 302, 303, 304, 305 and 306 may be determined depending on the system requirements. For example, the SBN 301 may be 1 or 2 bytes in size, the ESI 302 may be 2 or 3 byes in size, the PSP 303 may be 1 or 2 bytes in size and the SBL 306 may be 2 or 3 bytes in size.

The receiver may obtain the SBN 301, the ESI 302 and the PSP 303 from each source packet. If FEC decoding is needed as at least one source packet is erased, the receiver may receive at least one repair packet and obtain the SBL 306 from the repair packet. Upon obtaining information about the number of regions in the source block, which is additionally transmitted using a separate packet, the receiver may fully determine the structure of the source block corresponding to the SBN 301. The receiver may obtain the SBN 304 and the ESI 305 from each repair packet, and proceed with FEC decoding for the source block of the SBN using the received signaling information, thereby restoring the erased source packet.

FIG. 4 illustrates an example of signaling information added to a source packet according to an embodiment of the present disclosure.

Referring to FIG. 4, signaling information obtained by combining the ESI 302 and the PSP 303 in FIG. 3, i.e., a Subdivided Encoding Symbol Index or Identifier (SESI) 402 may be configured by subdividing each encoding symbol on the basis of each of the regions divided in an encoding symbol (for example, subdividing each encoded symbol by predetermined number and length), defining them as subdivided encoding symbols, and assigning the order to each of the subdivided encoding symbols, for each region. It is obvious that if the number of divided regions is m, the number of subdivided encoding symbols may be m times the total number of encoding symbols, and the size may be reduced to 1/m on average.

For example, if m=4 in FIG. 2, as encoding symbols are subdivided in the size of T/4, they may be defined as subdivided encoding symbols, which have increased in number 4 times the existing encoding symbols. Therefore, in the case of FIG. 2, a SESI value of the first source packet may be 0, a SESI value of the second source packet may be 10, an ESI and PSP value of the third source packet may be 19, and an ESI and PSP value of the fourth source packet may be 29.

Although a relationship of SESI=m*ESI+PSP is applied in this embodiment, it may be represented in various other one-to-one forms depending on the system settings.

As for the signaling information about the number m of divided regions, it is efficient to transmit the signaling information using a separate packet such as SDP, in terms of overhead. In an alternative embodiment, however, the signaling information may be transmitted by being added to a source packet or a repair packet.

As described above, the sender may regenerate a repair packet by applying FEC, using the source block that has a source symbol size T from given source packets as shown in FIG. 2 and is divided into m regions, and transmit the source packet and repair packet. A description will be made of an FEC decoding process in which the receiver may restore the source packet if at least one source packet is erased in the transmission process.

The receiver may receive at least one repair packet to restore the erased source packet, and have information about a value of T and a value of m in accordance with an agreement made in advance. The receiver may obtain the SBN 401, the SBL and the SESI 402 (or ESI and PSP) needed for FEC decoding, using a signaling means. Each of the information may be transmitted and received in a variety of ways depending on the system settings.

Figure 5:
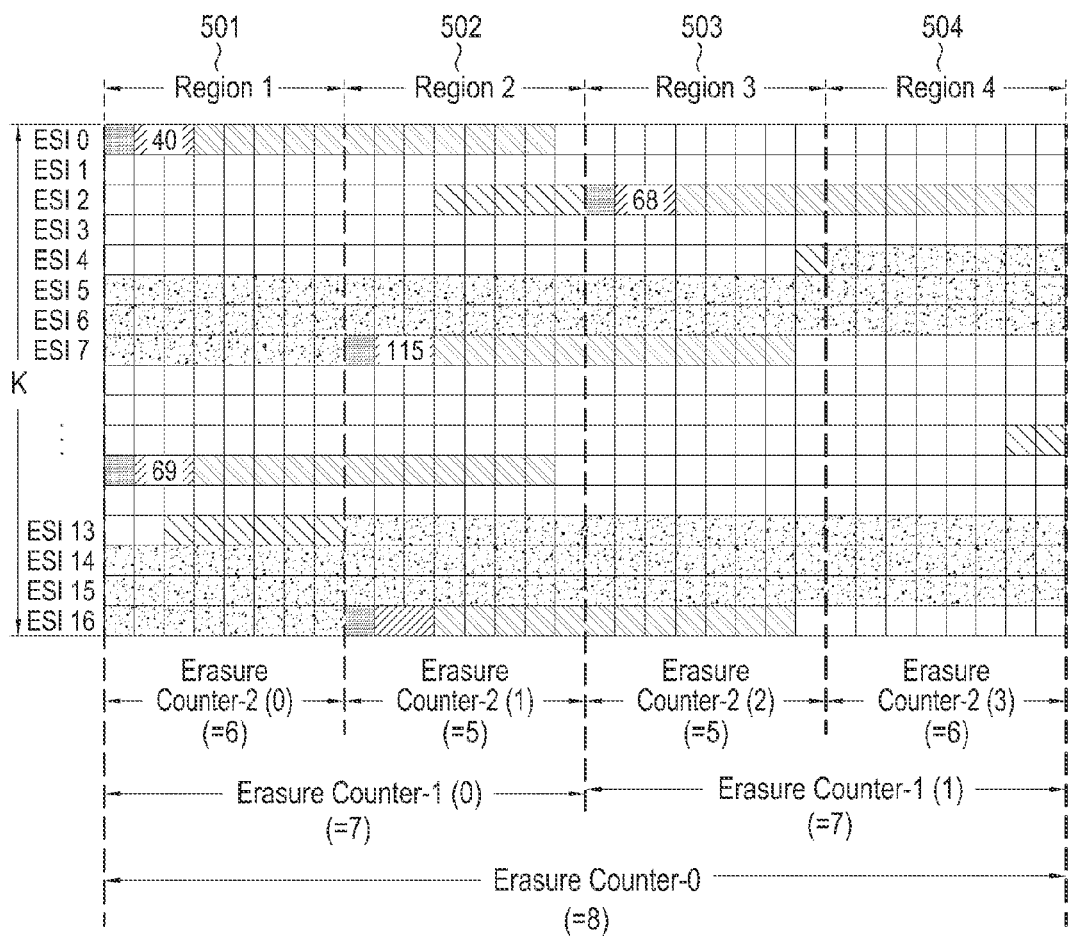
FIG. 5 illustrates an example of a source block including erased packets according to an embodiment of the present disclosure.

FIG. 5 illustrates an example of a source block including erased packets according to an embodiment of the present disclosure. In the illustrated example, the third and sixth source packets are erased from the source block 207 configured as illustrated in FIG. 2.

Referring to FIG. 5, it is noted that data corresponding to a SESI 19 to a SESI 28 and data corresponding to a SESI 53 to a SESI 68 are not received.

In order to proceed with FEC decoding to restore the erased encoding symbols or subdivided encoding symbols, the receiver needs to determine the positions of or the number of erased symbols. The positions of or the number of erased symbols may be defined differently depending on the FEC decoding scheme. Referring to FIG. 5, Erasure Counter-0, Erasure Counter-1 (0,1) and Erasure Counter-2 (0, 1, 2, 3) mean different FEC decoding schemes, i.e., mean a count value for the number of erased symbol units depending on each of different symbol units for FEC decoding.

First, a description will be made of a case of proceeding with FEC decoding in units of encoding symbols, as an example of a symbol unit.

The receiver needs to determine the positions of and the number of erased encoding symbols, and in FIG. 5, the erased encoding symbols determined through Erasure Counter-0 may include 8 encoding symbols, i.e., $4^{th}$, $5^{th}$, $6^{th}$, and $7^{th}$ encoding symbols and $13^{th}$, $14^{th}$, $15^{th}$ and $16^{th}$ encoding symbols. However, an index of the first encoding symbol is 0. Therefore, it is noted that in order to proceed with FEC decoding in units of encoding symbols, at least eight repair symbols (or parity symbols) are needed.

A specific example of determining the number of erased encoding symbols may be as follows.

The receiver may analyze SESI values corresponding to the source packets which are not received, based on the finally received source packets. A SESI value of an erased subdivided encoding symbol will be referred to as an Erased SESI (E-SESI). In FIG. 5, values of a SESI 19 to a SESI 28 and values of a SESI 53 to a SESI 64 are E-SESIs. The receiver may obtain a quotient by dividing E-SESI values by the number m of regions in the source block. In FIG. 5, m=4, values corresponding to a quotient [E-SESI/m] obtained by dividing E-SESIs having values of 19 to 28 and values of 53 to 64, by m=4, are 4, 5, 6, 7, 13, 14, 15 and 16, and they exactly match with the positions (for example, indexes) of the erased encoding symbols. Herein, for a real number x, [x] may mean the maximum integer which is not greater than x. The receiver may determine the number of erased encoding symbols by increasing Erasure counter-0 corresponding to the counter of erased encoding symbols each time one erased encoding symbol is determined. In the example of FIG. 5, finally, Erasure counter-0=8.

Figure 6:
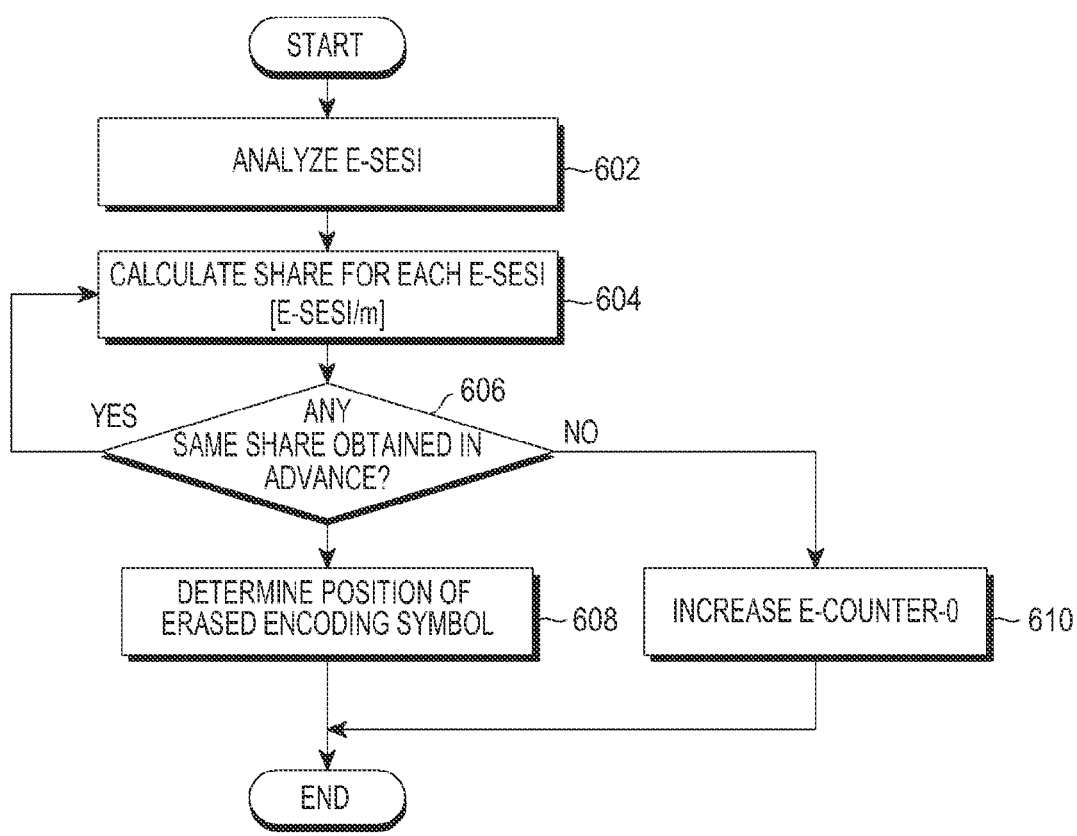
FIG. 6 is a flowchart illustrating an operation of determining positions of and the number of erased encoding symbols according to an embodiment of the present disclosure.

FIG. 6 is a flowchart illustrating an operation of determining positions of and the number of erased encoding symbols according to an embodiment of the present disclosure.

Referring to FIG. 6, in operation 602, the receiver may reconstruct a source block by arranging received source packets on a two-dimensional array having a certain size (for example, width) of a symbol, determine source packets which are not successfully received in the reconstructed source block, and obtain E-SESI values corresponding to the source packets which are not received. For example, the receiver may determine a missing source packet(s) between non-consecutive source packets, by determining and sequentially arranging the serial numbers of received source packets depending on a communication protocol such as, for example, a UDP.

In operation 604, the receiver may calculate a quotient (for example, 0 or a positive integer) by dividing each of the obtained E-SESI values by a certain value of m. If the same value as the calculated quotient has already been obtained for another E-SESI in operation 606, the receiver may return to operation 604 and calculate the next E-SESI value. If the same quotient has not been obtained, the receiver may determine the calculated quotient as a position (for example, an index) of the erased encoding symbol in operation 608, and increase Erasure Counter-0 for counting the number of erased encoding symbols, by 1 in operation 610.

Reference will be made to FIG. 5 to describe another embodiment of determining the number of erased encoding symbols.

In order to proceed with FEC decoding on the basis of a number of subdivided encoding symbols, the receiver may regard a number of consecutive subdivided encoding symbols as one partial encoding symbol, and use each partial encoding symbol as a symbol unit for FEC decoding. As an example, two consecutive subdivided encoding symbols may be one partial encoding symbol. Then, the receiver may determine that the $9^{th}$, $10^{th}$, $11^{th}$, $12^{th}$, $13^{th}$ and $14^{th}$ partial encoding symbols and $26^{th}$, $27^{th}$, $28^{th}$, $29^{th}$, $30^{th}$, $31^{st}$ and $32^{nd}$ partial encoding symbols are erased in the source block of FIG. 5. However, an index of the first partial encoding symbol is 0. If the number of erased partial encoding symbols is determined using Erasure Counter-1(0) and Erasure Counter-1(1) corresponding to the columns of the partial encoding symbols, the number of erased partial encoding symbols corresponding to a region #1 501 and a region #2 502 is 7, and the number of erased partial encoding symbols corresponding to a region #3 503 and a region #4 504 is 6. These are different from each other. Therefore, in order to proceed with FEC decoding in units of partial encoding symbols, at least seven repair symbols (or parity symbols) are needed.

Although it is defined in this embodiment that a partial encoding symbol is comprised of a certain number of, for example, 2 consecutive subdivided encoding symbols, the two subdivided encoding symbols do not necessarily need to be consecutive. For example, the subdivided encoding symbols corresponding to the region #1 501 and the region #3 503 may be defined as one partial encoding symbol, and the subdivided encoding symbols corresponding to the region #2 502 and the region #4 504 may be defined as another partial encoding symbol.

If a partial encoding symbol is defined with two subdivided encoding symbols, the number of erased partial encoding symbols may be determined for each region, as follows.

The receiver may analyze E-SESI values corresponding to missing source packets (for example, source packets which are not received) based on the finally received source packets. In FIG. 5, values of a SESI 19 to a SESI 28 and values of a SESI 53 to a SESI 64 are E-SESIs. The receiver may obtain a quotient by dividing E-SESI values by a value m/2 determined by dividing the number m of regions in the source block by 2. In FIG. 5, m/2=2, values corresponding to a quotient [E-SESI/(m/2)] obtained by dividing E-SESIs having values of 19 to 28 and values of 53 to 64, by m/2=2, are 9, 10, . . . , 14, 26, 27, . . . , 32, and they exactly match with the positions (for example, indexes) of the erased partial encoding symbols. The receiver may obtain a value of the remainder I by dividing again the obtained quotient by m/2, and increase Erasure Counter-1(I) corresponding to the counter of erased partial encoding symbols each time a value of I is obtained. In the example of FIG. 5, Erasure Counter-1(0)=7, since a remainder obtained by dividing $10^{th}$, $12^{th}$, $14^{th}$, $26^{th}$, $30^{th}$ and $32^{th}$ erased partial encoding symbols by m/2=2 is zero (0), and Erasure Counter-1(1)=6, since a remainder obtained by dividing $9^{th}$, $11^{th}$, $13^{th}$, $27^{th}$, $29^{th}$ and $31^{st}$ erased partial encoding symbols by m/2=2 is 1.

Figure 7:
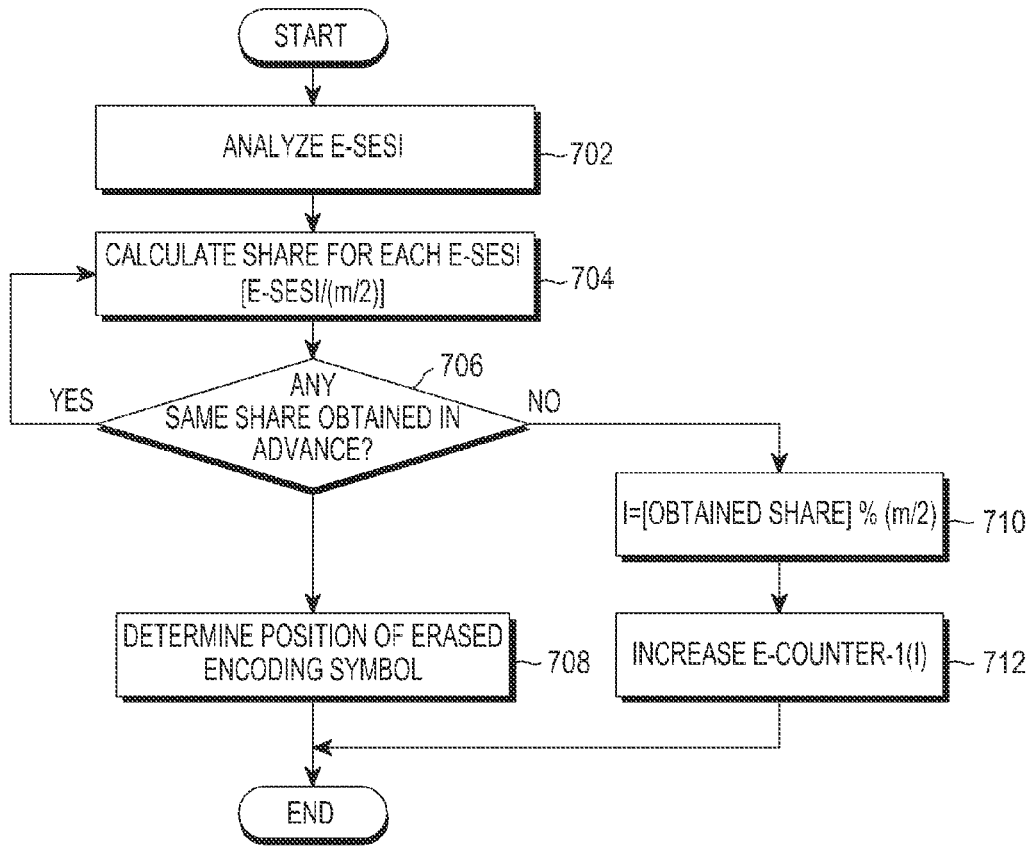
FIG. 7 is a flowchart illustrating an operation of determining positions of and the number of erased partial encoding symbols according to an embodiment of the present disclosure.

FIG. 7 is a flowchart illustrating an operation of determining positions of and the number of erased partial encoding symbols according to an embodiment of the present disclosure.

Referring to FIG. 7, in operation 702, the receiver may configure a source block by arranging received source packets on a two-dimensional array having a certain symbol size, determine missing source packets which are not successfully received in the configured source block, and obtain E-SESI values corresponding to the missing source packets. In operation 704, the receiver may calculate a quotient by dividing each of the obtained E-SESIs by m/2 for a certain value of m. If the same value as the calculated quotient has already been obtained for another E-SESI in operation 706, the receiver may return to operation 704 and calculate the next E-SESI value.

If the same quotient has not been obtained, the receiver may determine the calculated quotient as a position (for example, an index) of the erased partial encoding symbol in operation 708. On the other hand, the receiver may obtain a value I of a remainder by dividing the obtained quotient by m/2 in operation 710, and increase Erasure Counter-1(I) corresponding to the remainder value I by 1 to count the number of erased partial encoding symbols, in operation 712.

Reference will be made to FIG. 5 to describe further another embodiment of determining the number of erased encoding symbols.

In this embodiment, the receiver may use a subdivided encoding symbol as a symbol unit for FEC decoding. In order to proceed with FEC decoding on the basis of the encoding symbol subdivided in FIG. 5, the number of erased subdivided encoding symbols may be counted using Erasure Counter-2(0, 1, 2, 3) corresponding to the four regions. The number of erased subdivided encoding symbols corresponding to the region #1 501 is 6; the number of erased subdivided encoding symbols corresponding to the region #2 502 is 5; the number of erased subdivided encoding symbols corresponding to the region #3 503 is 5; and the number of erased subdivided encoding symbols corresponding to the region #4 504 is 6. These are different from one another. Therefore, in order to proceed with FEC decoding in units of subdivided encoding symbols, at least six repair symbols (or parity symbols) are needed.

In this embodiment, the number of erased subdivided encoding symbols may be determined for each region.

The receiver may analyze E-SESI values corresponding to the missing source packets based on the finally received source packets. Referring to FIG. 5, values of a SESI 19 to a SESI 28 and values of a SESI 53 to a SESI 64 are E-SESIs. The receiver may obtain a remainder I by dividing the E-SESI values by m indicating the number of regions in the source block. Referring to FIG. 5, m=4, and Erasure Counter-2(I) corresponding to a counter of subdivided encoding symbols for each region is increased by one, each time a value of I is obtained for the E-SESIs having values of 19 to 28 and values of 53 to 64. Referring to the example of FIG. 5, Erasure Counter-2(0)=6 since a remainder obtained by dividing 6 E-SESIs of 20, 24, 28, 56, 60 and 64 by m=4 is 0; Erasure Counter-2(1)=5 since a remainder obtained by dividing 5 E-SESIs of 21, 25, 53, 57 and 61 by m=4 is 1; Erasure Counter-2(2)=5 since a remainder obtained by dividing 5 E-SESIs of 22, 26, 54, 58 and 62 by m=4 is 2; and Erasure Counter-2(3)=6 since a remainder of 6 E-SESIs of 19, 23, 27, 55, 59 and 63 by m=4 is 3.

Figure 8:
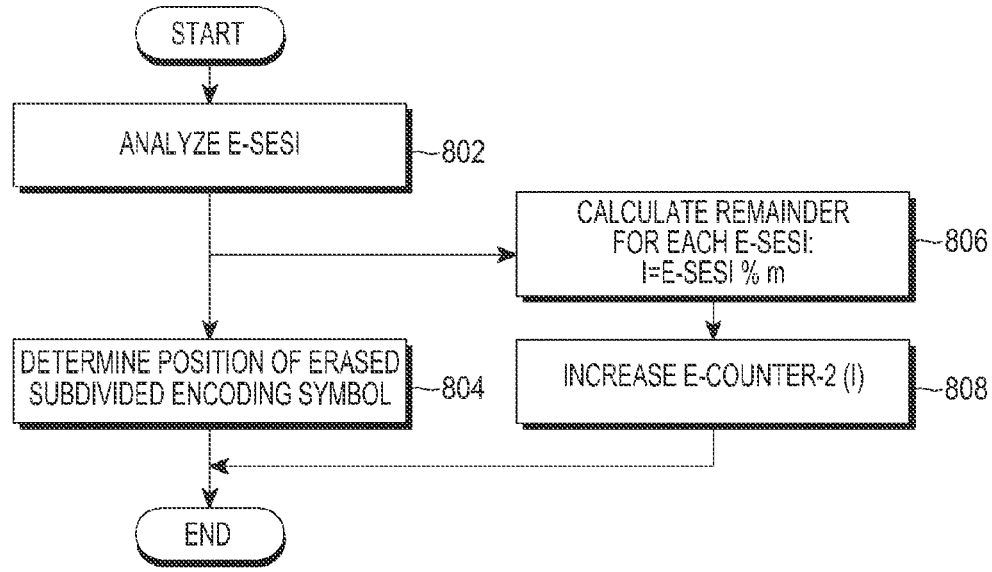
FIG. 8 is a flowchart illustrating an operation of determining positions of and the number of erased subdivided encoding symbols according to an embodiment of the present disclosure.

FIG. 8 is a flowchart illustrating an operation of determining positions of and the number of erased subdivided encoding symbols according to an embodiment of the present disclosure.

Referring to FIG. 8, in operation 802, the receiver may configure a source block by arranging received source packets on a two-dimensional array having a certain symbol size, determine missing source packets which are not successfully received in the configured source block, and obtain E-SESI values corresponding to the missing source packets. In operation 804, the receiver may determine positions of erased subdivided encoding symbols corresponding to the E-SESI values. In operation 806, the receiver may calculate a value of a remainder I by dividing each of the obtained E-SESIs by a value of m. In operation 808, the receiver may increase Erasure Counter-2(I) corresponding to the value of the remainder I by 1 to count the number of erased subdivided symbols, for each region.

In the above embodiments, the minimum unit, in which FEC decoding may be applied, is assumed to be a subdivided encoding symbol. Otherwise, the receiver may calculate the number of and positions of erased encoding symbols (or partial encoding symbols) using E-ESI other than E-SESI, or a partial encoding symbol ID for a partial encoding symbol configured as a part of an encoding symbol.

As shown in the above examples, the number of erased encoding symbols, the number of erased partial encoding symbols and the number of erased subdivided encoding symbols may be different from one another depending on the reference unit in which FEC decoding is applied, because the number of required repair symbols (or parity symbols) is different depending on the criteria based on which FEC decoding is applied. As the applying unit of the FEC decoding is less, the required number of required repair symbols (or parity symbols) may be smaller since the number of erased symbols is smaller. In other words, the overhead required for FEC decoding may be less.

On the other hand, as the applying unit of the FEC decoding is less, the decoding complexity may increase since FEC decoding should be performed several times for different error patterns. For example, if FEC decoding is applied in units of encoding symbols in FIG. 5 (the embodiment in FIG. 6), since the number of erased encoding symbols is 8, FEC decoding may be performed for one error pattern of the entire source block though at least eight repair symbols (or parity symbols) are needed. Therefore, efficient decoding is possible. However, if FEC decoding is applied in units of subdivided encoding symbols (the embodiment in FIG. 8), since the maximum number of erased subdivided encoding symbols is 6, the number of required repair symbols (or parity symbols) may be reduced and the required overhead may be reduced. However, the decoding complexity may slightly increase, since FEC decoding needs to be performed for different error patters, for each region.

In the below-described embodiment, a scheme of determining the efficient symbol unit for FEC decoding is proposed. As an example, a symbol unit may be selected as one of different symbol units such as an encoding symbol unit, a partial encoding symbol unit or a subdivided encoding symbol unit. For example, the receiver may select one proper symbol unit for FEC decoding based on the number of erased symbol units counted for each symbol unit. Although a description will be made of an operation in which an encoding symbol unit, a partial encoding symbol unit or a subdivided encoding symbol unit is used as an example of different symbol units, it will be apparent to those of ordinary skill in the art that the present disclosure is not limited to these specific symbol units. As an example, the receiver may select one of different symbol units including at least one of the encoding symbol unit, the partial encoding symbol unit and the subdivided encoding symbol unit.

For convenience of description, the number m of regions divided in a source block will be defined as $2^A$ where A denotes a positive integer. The number of erased encoding symbols is counted as E-Counter-0, the number of erased partial encoding symbols comprised of $m/2^i$ subdivided encoding symbols is counted as E-Counter-i, and the number of erased subdivided encoding symbols is counted as E-Counter-A.

Although m is limited to $2^A$ and the size of a partial encoding symbol is defined as a divisor of m for convenience of understanding in the following embodiment, m does not need to be limited and the size of a partial encoding symbol does not also need to be fixed at all times or does not need to be a divisor of m in alternative embodiments of the present disclosure.

If the receiver has failed to receive all source packets as a transmitted source packet is erased, the number of erased symbols corresponding to the erased packet may meet the following relationship of Equation (1) for each E-Counter.

$$(E\text{-Counter-}0) \geq (E\text{-Counter-}1) \geq \ldots \geq (E\text{-Counter-}A) \quad \text{Equation (1)}$$

In other words, the number of erased symbols may be larger as the size of the symbol is defined larger. In the case where FEC decoding is applied depending on the unit in which erased symbols are calculated, as the size of the symbol is defined larger, the required number of repair symbols (or parity symbols) needed to restore the source symbol (or the source packet) is larger, causing an increase in overhead.

However, as described above, in the case where the receiver proceeds with FEC decoding for small-sized symbols, the decoding complexity may increase since the receiver needs to proceed with FEC decoding several times for different error patterns. Therefore, the receiver may not select the efficient decoding scheme depending on the E-counters.

As the simplest example, values of all E-counters are assumed to be the same as in Equation (2) below.

$$(E\text{-Counter-}0) = (E\text{-Counter-}1) = \ldots = (E\text{-Counter-}A) \quad \text{Equation (2)}$$

In the case of Equation (2), if all E-counters are the same in terms of the number of erased symbols, they are almost the same even in terms of the number of required repair symbols (or parity symbols). In other words, since the overhead is almost the same, the receiver may determine to perform FEC decoding on the basis of the encoding symbol size whose decoding complexity is lowest.

As another simple example, values of E-Counters are as shown in Equation (3) below.

$$(E\text{-Counter-}0) = 10 \times (E\text{-Counter-}1) \quad \text{Equation (3)}$$

Since a value of E-Counter-0 is 10 times that of E-Counter-1, when the receiver proceeds with FEC decoding in units of encoding symbols, the overhead may be 10 times, compared with when the receiver applies FEC decoding in units of m/2 subdivided encoding symbols. If FEC decoding is applied to two different error patterns, the decoding complexity may increase, but it is more efficient compared with when the overhead increases 10 times. Therefore, the receiver may determine to apply FEC decoding in units of m/2 subdivided encoding symbols.

As a result, if there is an erased source packet, the receiver may determine an FEC decoding scheme as follows in order to restore the source block including the erased source packet. The receiver may configure a source block from the received source packets and calculate the number of erased symbols using E-Counters corresponding to different symbol sizes. Thereafter, the receiver may compare the calculated E-Counter values in a comparison method, and determine the symbol unit (for example, the symbol size) for application of FEC depending on the comparison results. The receiver may perform FEC decoding depending on the determined symbol unit.

Equation (4) below is a relationship for description of an embodiment for determining an FEC decoding scheme based on the E-Counter values.

$$(E\text{-Counter-}(i-1)) = R_i \times (E\text{-Counter-}i)(R_i \geq 1)$$

$$P_i = \Pi_{j=1}^{i} R_j$$

$$i = 1, 2, \ldots, A \qquad \text{Equation (4)}$$

where $R_i$ (or R_i) denotes the ratio between adjacent E-Counter values (for example, between E-Counter-i and E-Counter-(i-1)), and $P_i$ (or P_i) denotes an accumulated value of the percentages.

Figure 9:
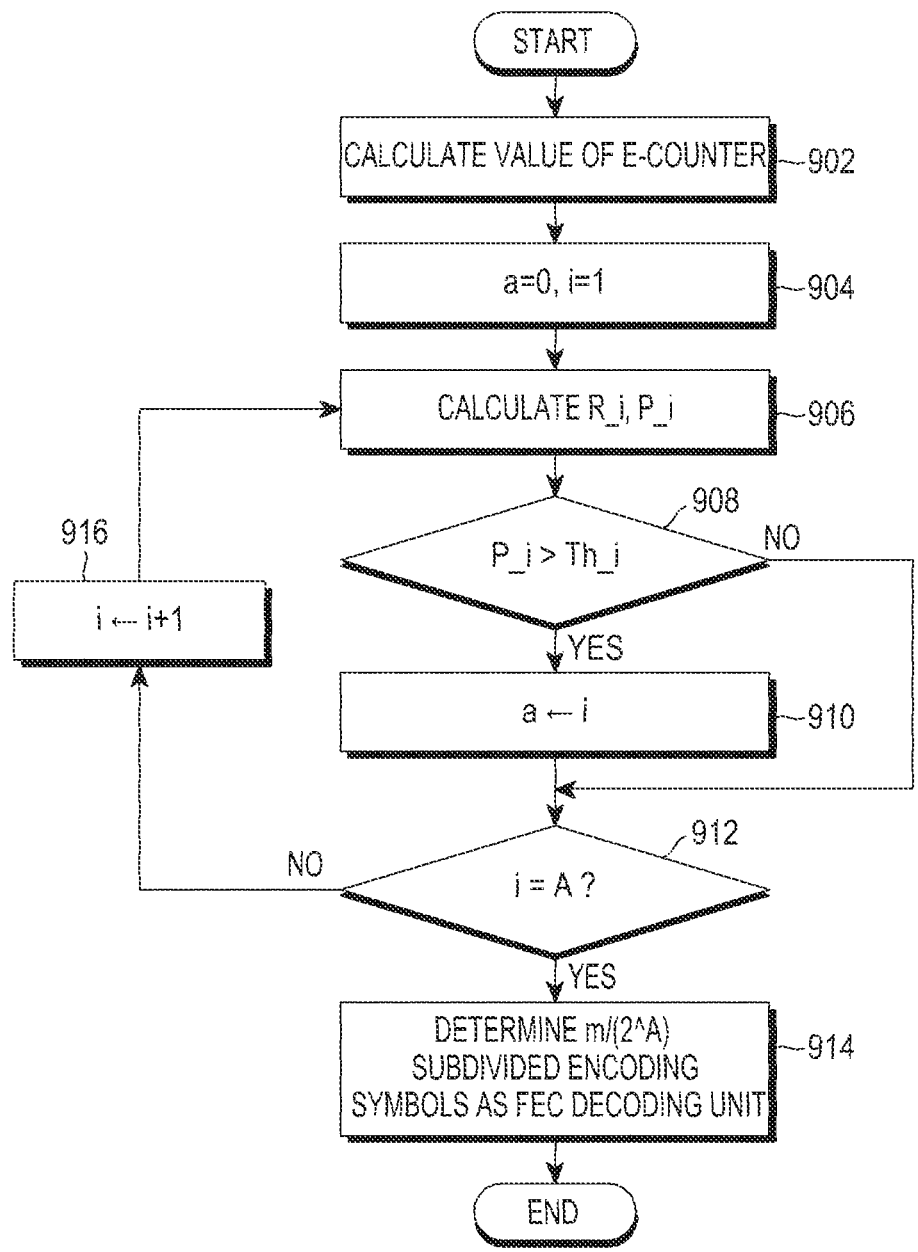
FIG. 9 is a flowchart illustrating an operation of determining a symbol unit for Forward Error Correction (FEC) decoding according to an embodiment of the present disclosure.

FIG. 9 is a flowchart illustrating an operation of determining a symbol unit for FEC decoding according to an embodiment of the present disclosure.

Referring to FIG. 9, the receiver may calculate E-Counter values corresponding to different symbol units (for example, symbol sizes) in accordance with the procedures shown in FIGS. 6, 7 and 8, in operation 902, and set a=0 and i=1 for initialization in operation 904. The receiver may calculate R_i and P_i in accordance with Equation (4) in operation 906, and compare P_i with a threshold Th_i in operation 908. If P_i is greater than Th_i, a value of 'a' may be substituted by a value 'i' in operation 910. On the other hand, if P_i is not greater than Th_i, the value of 'a' is not changed. The receiver determines in operation 912 whether T has reached 'A', and if T has not reached 'A', the receiver may increase 'i' by 1 in operation 916, and then return to operation 906.

Operations 906 to 910 are repeated A times until i=A. If i=A, the receiver may determine a symbol unit for FEC decoding as $m/2^a$ subdivided encoding symbols depending on the finally obtained value of 'a' in operation 914.

Equation (5) below is a relationship for a description of another embodiment for determining an FEC decoding scheme based on E-Counter values.

$$(E\text{-Counter-}(i-1)) = (E\text{-Counter-}i) + R_i(R_i > 0)$$

$$P_i = \Sigma_{j=1}^{i} R_j$$

$$i = 1, 2, \ldots, A \qquad \text{Equation (5)}$$

where $R_i$ (or R_i) denotes the difference between adjacent E-Counter values (for example, between E-Counter-(i) and E-Counter-(i-1)), and $P_i$ (or P_i) denotes an accumulated value of the differences between E-Counter values.

Referring to the flowchart of FIG. 9, the receiver may calculate R_i and P_i in accordance with Equation (5) in operation 906, and compare the calculated P_i with its threshold Th_i to determine a symbol unit for FEC decoding.

Referring to the structure of a sender in FIG. 1A, when the sender applies AL-FEC, the sender may sequentially divide given source packets into a certain number of source packets, and input each of the certain number of divided source packets to the source block configuration unit 102. The source block configuration unit 102 may configure a source block that is comprised of K source symbols based on given values of T and m, after inserting a UDP flow ID and length information of the source packet at the head of each of source packets. The FEC encoder 103 may generate a certain number of repair symbols by FEC-encoding the source block. In an alternative embodiment, the UDP flow ID and length information may be optional, or may be transmitted using another signaling means.

A signaling information generator (not shown) of the sender may assign an SBN and a SESI at the rear of each source packet in the way of FIG. 3 or FIG. 4, make at least one repair packet by connecting one or more repair symbols, and assign an SBN, an ESI and an SBL at the head of each repair packet. To the ESI of the repair packet is typically assigned an ESI of the first repair symbol of the packet. A UDP header is added at the head of each packet, and a source packet and a repair packet are comprised of UDP packets, which are separated from each other as different UDP port numbers are set therefor. During transmission of packets, FEC-related signaling information including T and m may be transmitted in advance using a signaling means such as SDP.

Referring to the structure of a receiver in FIG. 1B, the source block analyzer 112 of the receiver may determine whether a received packet is a source packet or a repair packet, based on the port number of a UDP header included in each received packet. If the received packet is a source packet, the source block analyzer 112 may obtain an SBN and a SESI stored at the rear of the source packet. Otherwise, if the received packet is a repair packet, the source block analyzer 112 may obtain an SBN, an ESI and an SBL assigned at the head of the repair packet. Thereafter, the source block analyzer 112 may reconstruct a source block and repair symbols from the received packets based on the T and m which are transmitted from the sender in advance. The FEC decoder 113 may perform FEC decoding on symbol units and repair symbols of the reconstructed source block depending on the symbol unit for application of FEC, which is determined in the operation of FIG. 9.

In another alternative embodiment, information about the symbol size T and the number m of divided regions may be transmitted in a separate packet or via a separate route. For convenience of understanding, a description will now be made of FEC Object Transmission Information (FEC OTI) that carries information about the symbol size T by SDP in 3GPP TS 26.346.

In other words, the FEC OTI may be comprised of the maximum source block length in symbols and the symbol size in bytes. The maximum source block length and the symbol size may be encoded with a 4-octet Network Byte Order field. The source block length information is signaled within a Repair FEC payload ID of a specific packet whose length does not exceed the maximum source block length indicated by the FEC OTI for a specific stream. The FEC OTI is transmitted by means of SDP. The Repair FEC payload ID means signaling information that is added to the repair packet to indicate the configuration of the source block.

Signaling information having a certain size may be additionally allocated to the FEC OTI, for a value of m indicating the number of regions divided in the source block or the number of symbols subdivided within one encoded symbol.

FIGS. 10A and 10B illustrate examples of FEC OTI according to an embodiment of the present disclosure.

Referring to FIG. 10A, the FEC OTI may include a Number of Subdivided Symbols (NSS) 1002 indicating the unit 'm' in which one encoded symbol is subdivided, a Symbol Size (T) 1001, and a Maximum Source Block Length 1003.

FIG. 10B illustrates the configuration of FEC OTI that is expressed by replacing the NSS 1002 in FIG. 10A with a Number of Regions (NOR) 1004. In other words, the NSS 1002 denotes a value obtained by subdividing one symbol on the basis of the system and the NOR 1004 denotes the number of regions divided in the source block, but actually their information may play the same role with the same value.

The NSS 1002 or the NOR 1004 may have different sizes depending on the system requirements, without specific limitations, and may have a size of, for example, one or two bytes. In FIGS. 10A and 10B, the Maximum Source Block Length 1003 may be transmitted or not transmitted depending on the system.

A description will be made of an example of determining the size of each subdivided symbol depending on the relationship between the symbol size T and the value m corresponding to the NSS or NOR value when one encoded symbol is subdivided.

If a quotient and a remainder obtained by dividing T by m are 'a' and 'b', respectively, i.e., if a relationship of T=m×a+b,0≤b≤m is met, the size of each of first b subdivided symbols may be set as (a+1) and the size of each of the remaining (m−b) subdivided symbols may be set as 'a'. It should be noted that the order of the subdivided symbols with the size of (a+1) and 'a' may be reversed. If T is a multiple of m, the sizes of the subdivided symbols may be the same as 'a'.

A description will be made of another example of determining the size of each subdivided symbol depending on the relationship between the symbol size T and the value m corresponding to the NSS or NOR value when one encoded symbol is subdivided.

If a quotient and a remainder obtained by dividing T by m are 'a' and 'b', respectively, i.e., if a relationship of T=m×a+b,0≤b≤m is met, the size of first one subdivided symbol may be set as (a+b) and the size of each of the remaining (m−1) subdivided symbols may be set as 'a'. The order of the subdivided symbols with the size of (a+b) and 'a' may be reversed.

As in the above examples, the size of subdivided symbols may be defined in a variety of ways. Alternatively, the size of subdivided symbols may be expressed in the number of columns that constitute each of the regions divided in the source block.

Reference will now be made to FIG. 11 to describe examples of a Source FEC Payload ID which is signaling information (for example, source packet-added information) added to a source packet to indicate the configuration of a source block, a Repair FEC Payload ID which is signaling information (for example, repair packet-added information) added to a repair packet, and one set (or suite) of FEC OTI, when a process of configuring a source block and applying FEC thereto is used as a way to restore lost packets in the broadcasting and communication system.

FIG. 11 illustrates an example of signaling information transmitted to indicate the configuration of a source block according to an embodiment of the present disclosure.

Referring to FIG. 11, if FEC decoding is needed as some transmitted source packets are lost or erased, and the receiver proceeds with FEC decoding using one or more repair packets, the receiver may understand (or determine) the configuration of a source block by obtaining a Symbol Size (T) 1001 and an NSS (m) 1002 from an FEC OTI 1102, obtaining an SBN 401 and a SESI 402 from source packet-added information (or Source FEC Payload ID) 1104, and obtaining an SBL 306 from repair packet-added information (or Repair FEC Payload ID) 1106, and reconstruct the source block by properly arranging received source packets using the obtained information. Since the SESI 402 indicates the position at which each of received source packets starts on the basis of subdivided symbols within the source block, the receiver may exactly arrange each of the received source packets. The position corresponding to the erased source packet may be treated as erasure.

The receiver may perform FEC decoding by recognizing the mapping relationship of the source block and the repair packet based on the SBN 401 obtained from the source packet-added information 1104, and the SBN 304 and the ESI 305 obtained from the repair packet-added information 1106. The FEC decoder may obtain an NSS (for example, a value of m) from the FEC OTI 1102 and divide the source block into m regions, thereby to perform decoding. In an alternative embodiment, the receiver may perform decoding by regarding one region in units of the symbol size T without dividing the source block into m regions. If the receiver performs decoding by regarding one region in units of the symbol size T, all rows including the erased source packet and its additional information's data may be treated as erasure.

One set (or suite) of signaling information illustrated in FIG. 11 may include all information needed in the process of repairing the erased source packet in the receiver. Referring to FIG. 11, the Maximum Source Block Length 1003 may be transmitted or omitted depending on the situation of the system.

Figure 12:
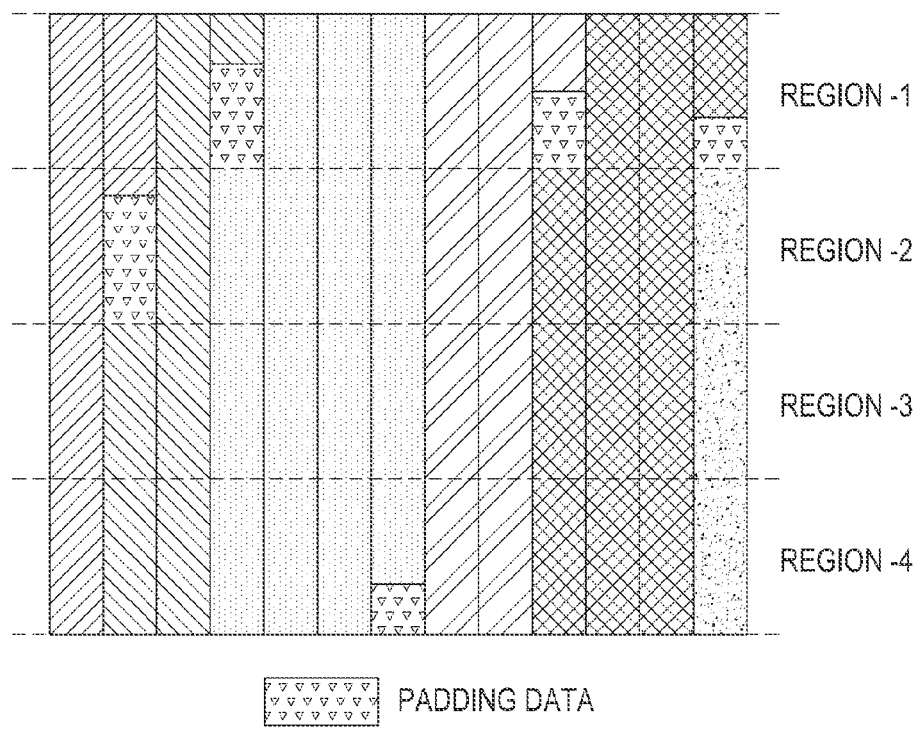
FIGS. 12, 13, and 14 illustrate a structure of a source block and count values for erased symbol units according to an embodiment of the present disclosure.
Figure 13:
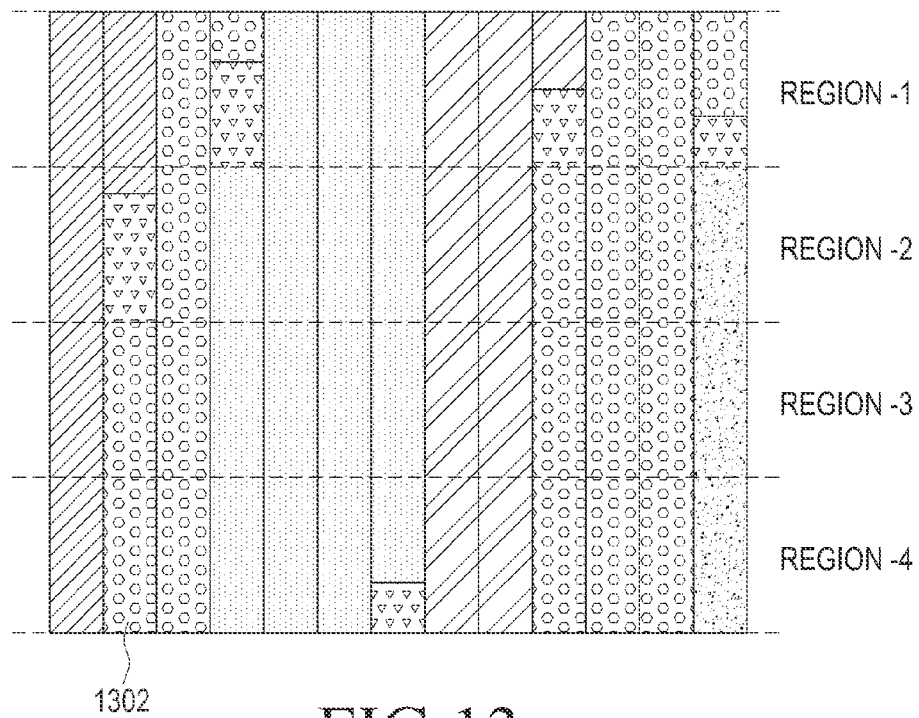
Figure 14:
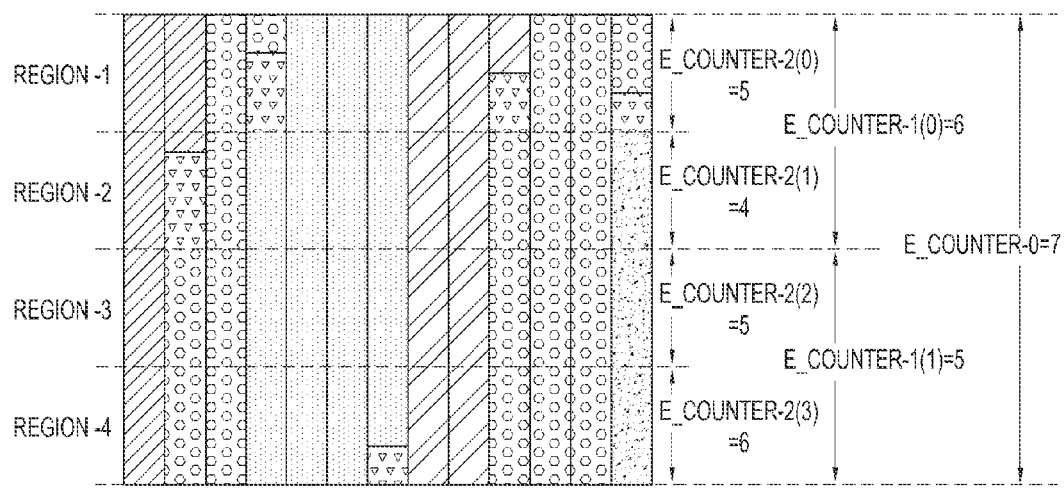

FIGS. 12, 13 and 14 illustrate a structure of a source block and count values for erased symbol units according to an embodiment of the present disclosure.

Referring to FIG. 12, a source block is configured by sequentially arranging given source packets on a two-dimensional array having a certain length. The source block is divided into four regions Region-1, Region-2, Region-3 and Region-4, and each source packet is arranged beginning from the starting point of a certain region. As described above, the empty space between each source packet and the starting point of the next region may undergo padding. At least some of source packets may additionally include signaling information such as at least one of a flow ID for the applied protocol and a length field of the source packet.

FIG. 13 illustrates a reconstructed source block in the case where second and fifth source packets in the source block of FIG. 12 are erased during their transmission. E-Counters illustrated in FIG. 14 are used to count symbol units corresponding to the erased source packets. For example, E-Counter-0 indicates the number of erased encoding symbols for an encoding symbol unit corresponding to one column of each source block; E-Counter-2(0, 1, 2, 3) indicates the number of erased subdivided encoding symbols for the subdivided encoding symbol unit corresponding to each region; and E-Counter-1(0,1) indicates the number of erased partial encoding symbols for a partial encoding symbol unit comprised of two or more subdivided encoding symbol units.

Figure 15:
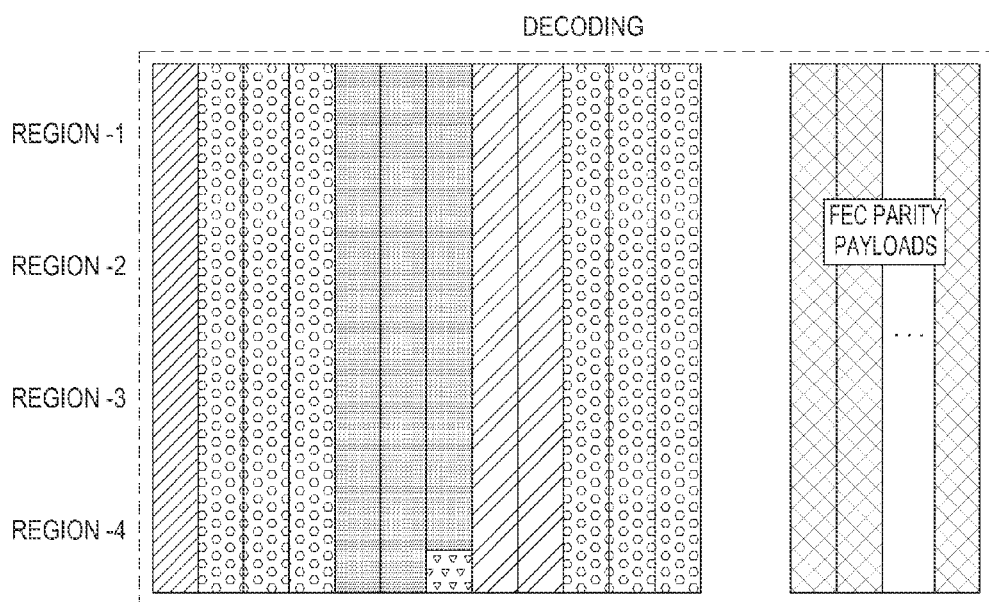
FIGS. 15, 16, and 17 illustrate FEC decoding for different symbol units according to embodiments of the present disclosure.
Figure 16:
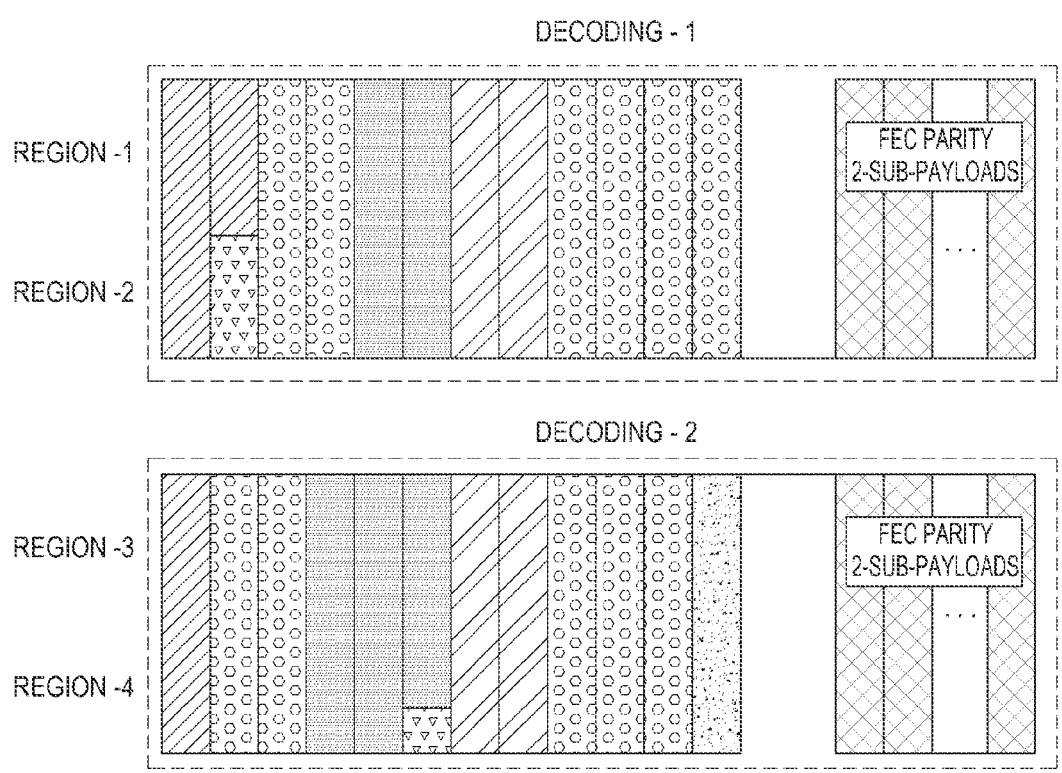
Figure 17:
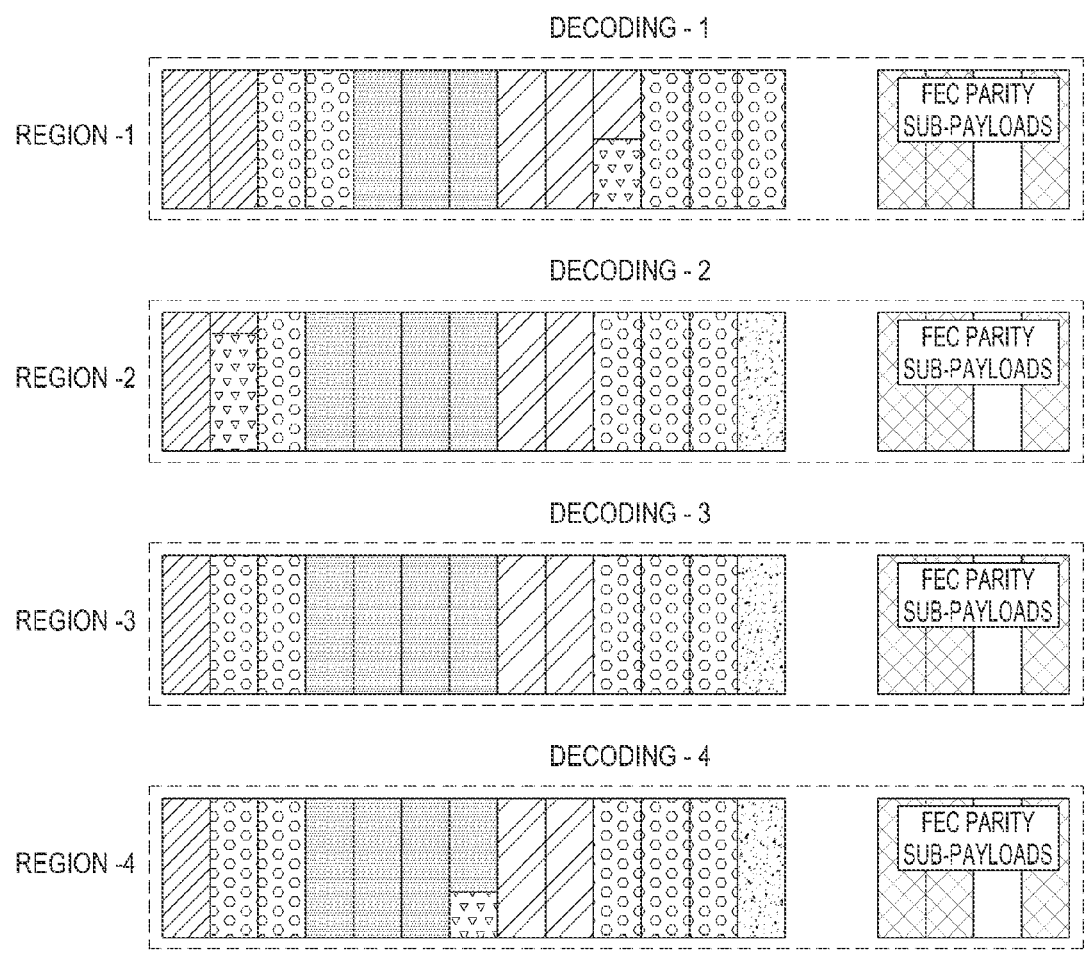

FIGS. 15 to 17 illustrate FEC decoding for different symbol units selected depending on the comparison results of E-Counters according to an embodiment of the present disclosure.

Referring to FIG. 15, it is regarded that the $2^{nd}$, $3^{rd}$, $4^{th}$, $10^{th}$, $11^{th}$, $12^{th}$ and $13^{th}$ encoding symbols corresponding to the $2^{nd}$ and $5^{th}$ source packets are erased, and the FEC decoder may repair the erased encoding symbols by performing FEC decoding on the received source packets and repair packets (for example, parity payloads). The term 'parity payload' as used herein may refer to an information unit constituting a repair packet (or parity packet). The repair packet (or parity packet) may include one or more FEC parity payloads and signaling information (or protocol information for repair packets).

Referring to FIG. 16, it is regarded that the $3^{rd}$, $4^{th}$, $9^{th}$, $10^{th}$, $11^{th}$ and $12^{th}$ partial encoding symbols corresponding to the $2^{nd}$ and $5^{th}$ source packets are erased in a first partial region including Region-1 and Region-2, and the FEC decoder may repair the erased partial encoding symbols by performing first FEC decoding (Decoding-1) on partial encoding symbols in the first partial region among the received source packets and repair packets (for example, parity sub-payloads). The term 'parity sub-payload' as used herein may refer to an information unit obtained by subdividing an FEC parity payload to match with the size of subdivided encoding symbols of the source block, and the term 'A-sub-payload' as used herein may refer to a partial FEC parity payload comprised of A sub-payloads.

Likewise, it is regarded that the $2^{nd}$, $3^{rd}$, $9^{th}$, $10^{th}$ and $11^{th}$ partial encoding symbols corresponding to the $2^{nd}$ and $5^{th}$ source packets are erased in a second partial region including Region-3 and Region-4, and the FEC decoder may repair the erased partial encoding symbols by performing second FEC decoding (Decoding-2) on partial encoding symbols in the second partial region among the received source packets and repair packets (for example, parity sub-payloads).

Referring to FIG. 17, it is regarded that the $3^{rd}$, $4^{th}$, $11^{th}$, $12^{th}$ and $13^{th}$ subdivided encoding symbols corresponding to the $2^{nd}$ and $5^{th}$ source packets are erased in Region-1, and the FEC decoder may repair the erased subdivided encoding symbols by performing first FEC decoding (Decoding-1) on the subdivided encoding symbols in Region-1 among the received source packets and repair packets. Similarly, the $3^{rd}$, $10^{th}$, $11^{th}$ and $12^{th}$ subdivided encoding symbols are repaired by FEC decoding (Decoding-2) in Region-2; the $2^{nd}$, $3^{rd}$, $10^{th}$, $11^{th}$ and $12^{th}$ subdivided encoding symbols are repaired by FEC decoding (Decoding-3) in Region-3; and the $2^{nd}$, $3^{rd}$, $10^{th}$, $11^{th}$ and $12^{th}$ subdivided encoding symbols are repaired by FEC decoding (Decoding-4) in Region-4.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for decoding received packets in a broadcasting and communication system, the method comprising:
   reconstructing a source block having a width of a given symbol size by arranging source packets received from a sender;
   determining a number of erased encoding symbol units corresponding to at least one source packet which is not successfully received in the source block;
   determining a decoding unit for Forward Error Correction (FEC) decoding based on the number of erased encoding symbol units; and
   performing FEC decoding on the reconstructed source block based on the determined decoding unit.

2. The method of claim 1, wherein the determining of the decoding unit comprises:
   determining the number of erased encoding symbol units for each of a plurality of symbol units for FEC decoding in the source block based on at least one Erased Subdivided Encoding Symbol Index (E-SESI) corresponding to at least one source packet which is not successfully received in the source block; and
   selecting at least one of the plurality of symbol units as the decoding unit based on the number of erased encoding symbol units.

3. The method of claim 2, wherein the plurality of symbol units include at least one of:
   an encoding symbol unit corresponding to each row of the reconstructed source block;
   a subdivided encoding symbol unit obtained by dividing each encoding symbol unit by m; and
   a partial encoding symbol unit including p subdivided encoding symbols, where p denotes an integer greater than or equal to 2.

4. The method of claim 3, wherein the determining of the decoding unit comprises:
   determining a count value E-Counter-0 for the number of erased encoding symbols based on the encoding symbol unit, a count value E-Counter-2(I) for the number of m erased subdivided encoding symbols based on the subdivided encoding symbol unit, and a count value E-Counter-1(I) for the number of m/p erased partial encoding symbols based on the partial encoding symbol unit; and
   determining the decoding unit, based on a decoding complexity based on the E-Counter-0, E-Counter-2(i) and E-Counter-1(j), and an overhead based on each symbol unit.

5. The method of claim 4, wherein the determining of the decoding unit comprises:
   calculating a ratio R_i between E-Counter-(i) to E-Counter-(i−1) among the count values;
   calculating an accumulated value P_i of the R_i; and
   determining $m/2^a$ subdivided encoding symbols as the decoding unit, based on a maximum value 'a' of 'i' by which the P_i is greater than a threshold Th_i.

6. The method of claim 4, wherein the determining of the decoding unit comprises:
   calculating a difference R_i between E-Counter-(i) and E-Counter-(i−1) among the count values;
   calculating an accumulated value P_i of the R_i; and
   determining $m/2^a$ subdivided encoding symbols as the decoding unit, based on a maximum value 'a' of 'i' by which the P_i is greater than a predetermined threshold Th_i.

7. An apparatus for decoding received packets in a broadcasting and communication system, the apparatus comprising:
   a source block analyzer configured:
      to reconstruct a source block having a width of a given symbol size by arranging source packets received from a sender,
      to determine a number of erased encoding symbol units corresponding to at least one source packet which is not successfully received in the source block, and
      to determine a decoding unit for Forward Error Correction (FEC) decoding based on the at least one E-SESI; and
   a decoder configured to perform FEC decoding on the source block based on the determined decoding unit.

8. The apparatus of claim 7, wherein the source block analyzer is further configured:
   to determine the number of erased encoding symbol units for each of a plurality of symbol units for FEC decoding in the source block based on at least one Erased Subdivided Encoding Symbol Index (E-SESI) corresponding to at least one source packet which is not successfully received in the reconstructed source block; and
   to select at least one of the plurality of symbol units as the decoding unit based on the number of erased encoding symbol units.

9. The apparatus of claim 8, wherein the plurality of symbol units include at least one of:
   an encoding symbol unit corresponding to each row of the reconstructed source block;

a subdivided encoding symbol unit obtained by dividing each of the encoding symbol unit by m; and a partial encoding symbol unit including p subdivided encoding symbols, where p denotes an integer greater than or equal to 2.

10. The apparatus of claim 9, wherein the source block analyzer is further configured:

to determine a count value E-Counter-0 for the number of erased encoding symbols based on the encoding symbol unit, a count value E-Counter-2(I) for the number of m erased subdivided encoding symbols based on the subdivided encoding symbol unit, and a count value E-Counter-1(I) for the number of m/p erased partial encoding symbols based on the partial encoding symbol unit; and to determine the decoding unit, based on a decoding complexity based on the E-Counter-0, E-Counter-2(i) and E-Counter-1(j), and an overhead based on each symbol unit.

11. The apparatus of claim 10, wherein the source block analyzer is further configured:

to calculate a ratio R_i between E-Counter-(i) to E-Counter-(i−1) among the count values;

to calculate an accumulated value P_i of the R_i; and to determine $m/2^a$ subdivided encoding symbols as the decoding unit, based on a maximum value 'a' of 'i' by which the P_i is greater than a predetermined threshold Th_i.

12. The apparatus of claim 10, wherein the source block analyzer is further configured:

to calculate a difference R_i between E-Counter-(i) and E-Counter-(i−1) among the count values;

to calculate an accumulated value P_i of the R_i; and to determine $m/2^a$ subdivided encoding symbols as the decoding unit, based on a maximum value 'a' of 'i' by which the P_i is greater than a threshold Th_i.

* * * * *